US010134670B2

(12) United States Patent
Hartswick et al.

(10) Patent No.: US 10,134,670 B2
(45) Date of Patent: Nov. 20, 2018

(54) WAFER WITH PLATED WIRES AND METHOD OF FABRICATING SAME

(71) Applicant: International Business Machines Corporation, Armonk, NY (US)

(72) Inventors: Thomas J. Hartswick, Underhill, VT (US); Anthony K. Stamper, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/681,481

(22) Filed: Apr. 8, 2015

(65) Prior Publication Data

US 2016/0300793 A1    Oct. 13, 2016

(51) Int. Cl.
| | |
|---|---|
| *H01L 21/8222* | (2006.01) |
| *H01L 23/522* | (2006.01) |
| *H01L 21/288* | (2006.01) |
| *H01L 23/64* | (2006.01) |
| *H01L 21/768* | (2006.01) |
| *H01L 23/58* | (2006.01) |

(52) U.S. Cl.
CPC ...... *H01L 23/5227* (2013.01); *H01L 21/2885* (2013.01); *H01L 21/76885* (2013.01); *H01L 23/585* (2013.01); *H01L 23/645* (2013.01)

(58) Field of Classification Search
CPC .................................................. H01L 23/5227
USPC ....................................................... 438/329
See application file for complete search history.

(56) References Cited

U.S. PATENT DOCUMENTS

| | | | |
|---|---|---|---|
| 3,849,872 | A | 11/1974 | Hubacher |
| 6,054,756 | A | 4/2000 | DiStefano et al. |
| 6,103,552 | A * | 8/2000 | Lin .......... H01L 24/03 257/E21.508 |
| 6,303,423 | B1 * | 10/2001 | Lin .......... H01L 21/768 257/E21.004 |
| 6,350,633 | B1 * | 2/2002 | Lin .......... H01L 21/2885 257/E21.175 |
| 6,486,563 | B1 | 11/2002 | Lin |
| 7,586,175 | B2 | 9/2009 | Lee et al. |
| 8,106,493 | B2 | 1/2012 | Tsui et al. |
| 8,236,613 | B2 | 8/2012 | Gong |
| 2003/0022493 | A1 * | 1/2003 | Jiang .......... H01L 21/2885 438/687 |
| 2003/0219969 | A1 * | 11/2003 | Saito .......... H01L 21/4857 438/622 |
| 2004/0021139 | A1 * | 2/2004 | Jackson .......... H01L 21/76898 257/40 |

(Continued)

FOREIGN PATENT DOCUMENTS

TW            452949 B      9/2001

*Primary Examiner* — Ajay K Arora
(74) *Attorney, Agent, or Firm* — Steven J. Meyers; Hoffman Warnick LLC

(57) ABSTRACT

An aspect of the invention includes a method for plating wires on a wafer comprising: forming an array of integrated circuit (IC) chips having a redistribution level; forming a kerf bus, the kerf bus separating each of the IC chips from each other, the kerf bus being connected to an edge of the wafer; forming an array of wires in the redistribution level of each IC chip; electrically connecting at least one wire in the array of wires on each IC chip to the kerf bus; and electroplating the array of IC chips.

10 Claims, 7 Drawing Sheets

(56) References Cited

U.S. PATENT DOCUMENTS

| | | | |
|---|---|---|---|
| 2005/0104217 A1* | 5/2005 | Narayan | H01L 24/10 257/769 |
| 2007/0087547 A1 | 4/2007 | Chen et al. | |
| 2009/0108444 A1 | 4/2009 | Chuang | |
| 2013/0020674 A1* | 1/2013 | Leal | H01L 23/5256 257/530 |
| 2014/0167251 A1 | 6/2014 | Iwata | |

* cited by examiner

WAFER WITH PLATED WIRES AND METHOD OF FABRICATING SAME

BACKGROUND

The present invention relates to a semiconductor wafer, and more specifically, to a semiconductor wafer with plated wires, and a method of fabricating the same.

Typically, semiconductor fabrication includes forming many integrated circuit (IC) chips on a single wafer. Referring to FIG. 1, IC chips 2 on a single wafer 10 are illustrated. Wafer 10 includes substrate (not shown in FIG. 1) upon which chips 2 are fabricated. Chips 2 are fabricated on wafer 10 by forming numerous layers on wafer 10. As layers are formed, they may be patterned and etched to create various semiconductor structures (i.e., diodes, transistors, inductors, wires, contacts, vias, etc.). Various levels may be created within a single chip 2 by forming a plurality of layers having additional semiconductor structures. Wafer 10 may also include kerf regions 4. Kerf region 4 is the region between chips 2 and can contain dicing channel, electrical test, lithographic measurement, and other structures. Kerf regions 4 typically include materials used in fabrication of chips 2 and facilitate separation of chips 2 such as by dicing. Kerf regions 4 may include a conductive kerf bus 6 as known in the art. Kerf bus 6 may include a metallization on a substrate (not shown in FIG. 1). Kerf bus 6 may run in kerf regions 4 and connect to edges 8 of wafer 10. Once chips 2 are completed, they are tested, diced from wafer 10, and may be connected to external circuity, e.g., a circuit board (not shown).

Generally, the last layer of a chip includes copper wires to facilitate electrical connection of the chip to the circuit board using, for example, one or more of wirebonds, solder bumps, or copper pillars. Conventionally, thin wires were created by traditional damascene processes. The damascene process includes forming a trench in a dielectric layer within a chip, depositing a liner/seed layer to coat the trench, filling the trench with metal, and then polishing the metal to form a recessed wire. These conventional damascene processes have wire heights of approximately 1 micron or less. Recently, thicker wires of approximately 2 to 12 microns in height (thickness) have been used to create intralevel ultra-low resistance structures as well as inductors on the chip. More specifically, these thicker wires are approximately 6 microns thick. However, the conventional damascene process is not advantageous for fabricating these thicker wires because it is complex and expensive. Additionally, fabrication of thick wires was traditionally performed on the circuit board. More recently, the wires have been fabricated on the wafer to reduce cost and improve performance.

SUMMARY

A first aspect of the invention includes a method for plating wires on a wafer comprising: forming an array of integrated circuit (IC) chips having a redistribution level on the wafer; forming a kerf bus, the kerf bus separating each of the IC chips from each other, the kerf bus being connected to an edge of the wafer; forming an array of wires in the redistribution level of each IC chip; electrically connecting at least one wire in the array of wires on each IC chip to the kerf bus; and electroplating the array of IC chips.

A second aspect of the invention includes a method for plating wires on a wafer comprising: forming an array of integrated circuit (IC) chips having a redistribution level on the wafer; forming a kerf bus in a kerf region, the kerf region separating each of the IC chips from each other, and the kerf bus being connected to an edge of the wafer; depositing a metal layer on a substrate in the redistribution level of each IC chip; patterning the metal layer to define an array of wires such that at least one wire in the array of wires on each IC chip is electrically connected to the kerf bus; and electroplating the IC chips such that a plated film is formed on the metal layer of each IC chip.

A third aspect of the invention includes a semiconductor wafer comprising: an array of integrated circuit (IC) chips separated by a kerf region having a kerf bus; and an array of wires in a redistribution level of each IC chip, each wire in the array of wires including, a patterned metal layer; and a plated film over the patterned metal layer; and wherein at least one wire in the array of wires on each IC chip is connected to the kerf bus.

BRIEF DESCRIPTION OF THE SEVERAL VIEWS OF THE DRAWINGS

These and other features of the present invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention.

DETAILED DESCRIPTION

The present invention provides a structure and method of plating or electroplating wires on a wafer. As discussed previously, copper wires were conventionally recessed and formed by standard damascene processes. However, damascene processes are not efficient to create very thick copper wires. Aspects of the present invention include depositing a thin metal layer on the wafer, and patterning the metal layer to connect the metal layer to a kerf. Once the metal layer is patterned, films are plated over the patterned metal layer. Therefore, aspects of the present invention provide for wires that are on the surface of the wafer instead of being recessed in trenches. It is to be understood that embodiments of the present invention may be employed at any metal level of an integrated circuit (IC) chip on a wafer. However, embodiments of the present invention are shown and described with reference to the last levels of the wafer, i.e., the redistribution level (RDL), which may be 3-10 microns (µm) thick. Typically, a RDL may consist of one or two levels of wiring although any number of levels of wiring separated by an insulating layer can be used.

Figure 2:
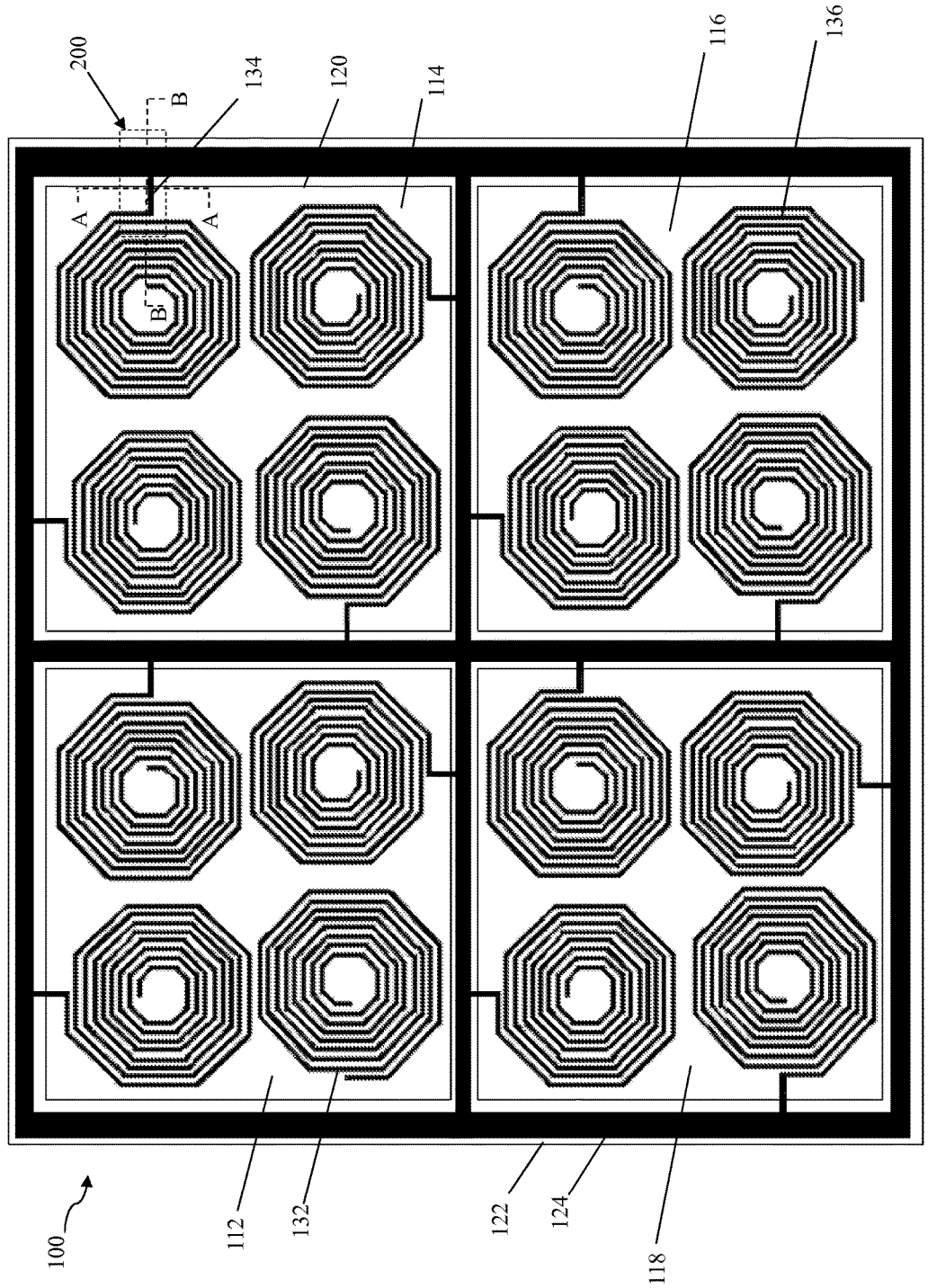
FIG. 2 shows a plan view of a portion of a semiconductor wafer according to aspects of the invention.
Figure 3:
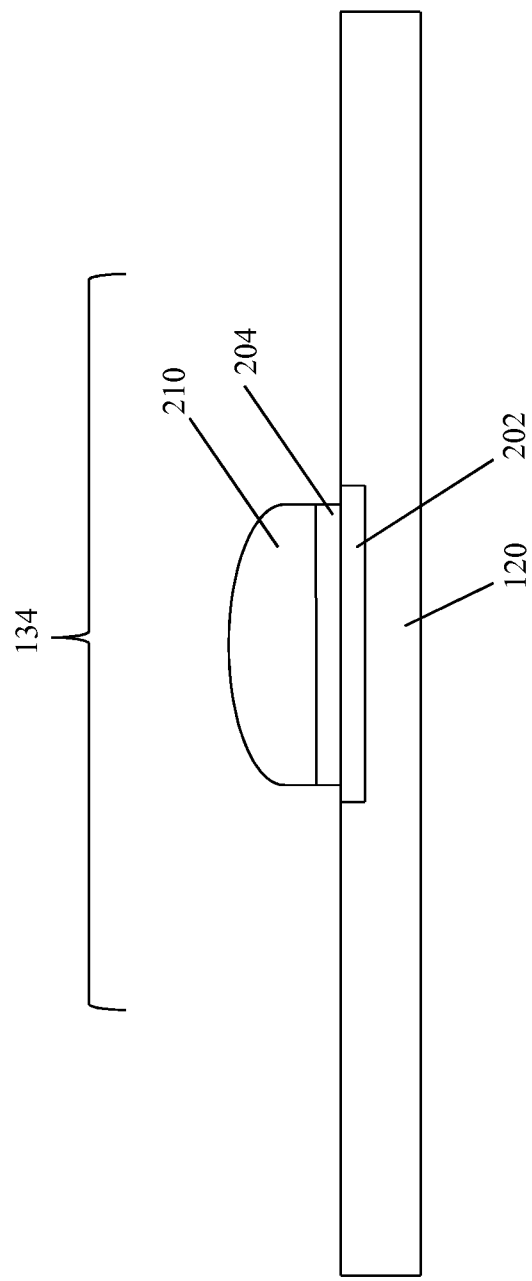
FIG. 3 shows a cross-sectional view of a portion of the semiconductor wafer of FIG. 2 along line A-A.
Figure 4:
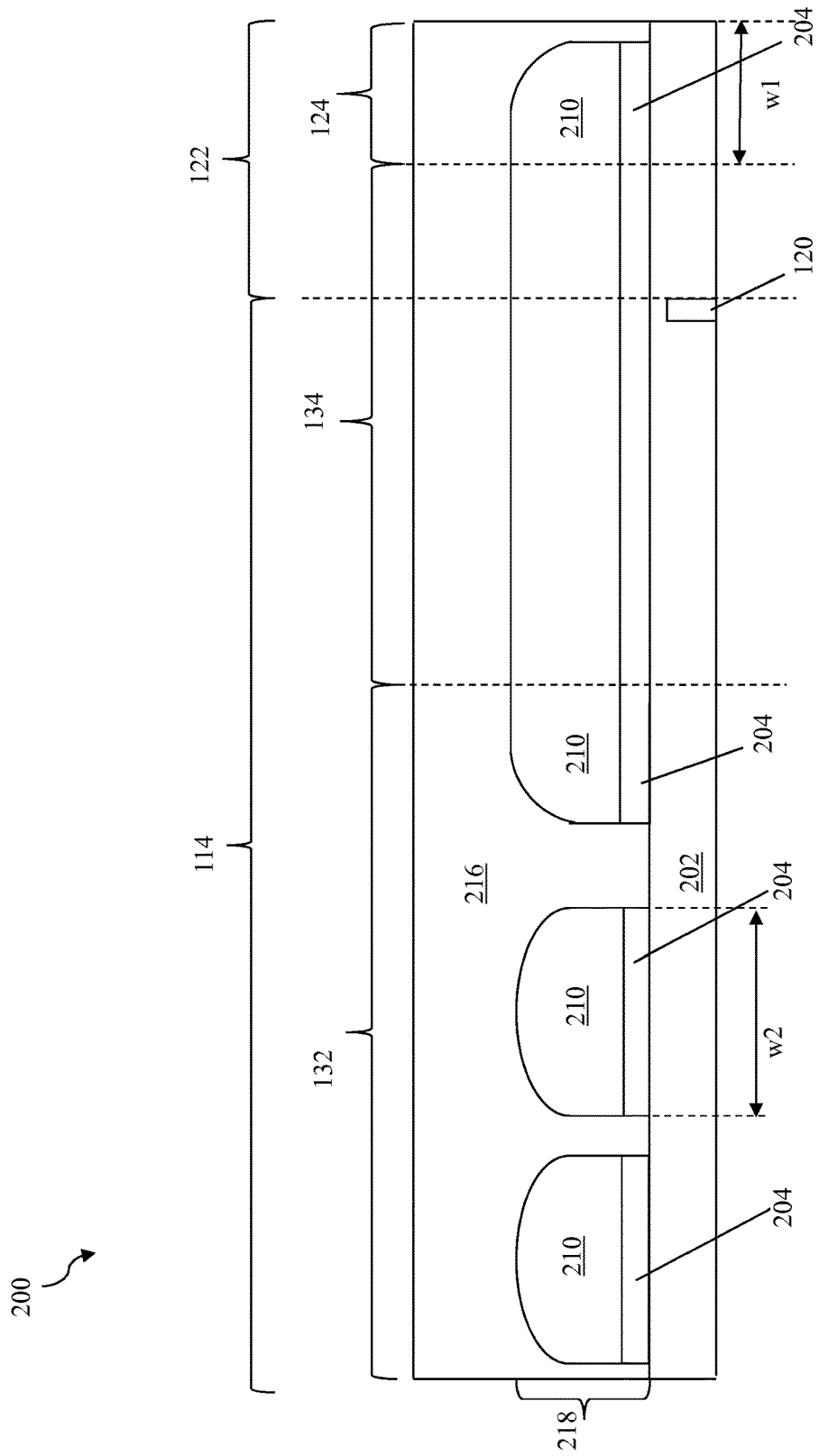
FIG. 4 shows a cross-sectional view along a portion of the semiconductor wafer of FIG. 2 along line B-B.

FIG. 2 shows a plan view of a portion of a semiconductor wafer 100 according to aspects of the present invention. FIG. 3 shows a cross-sectional view of a portion 200 of the semiconductor wafer 100 (shown by box with dotted lines in FIG. 2) along line A-A. FIG. 4 shows a cross-sectional view along the portion 200 of semiconductor wafer 100 along line B-B. It is to be understood that aspects of the present invention will first be introduced with respect to FIGS. 2-4, but will be further described herein with respect to a method of fabricating semiconductor wafer 100.

Figure 1:
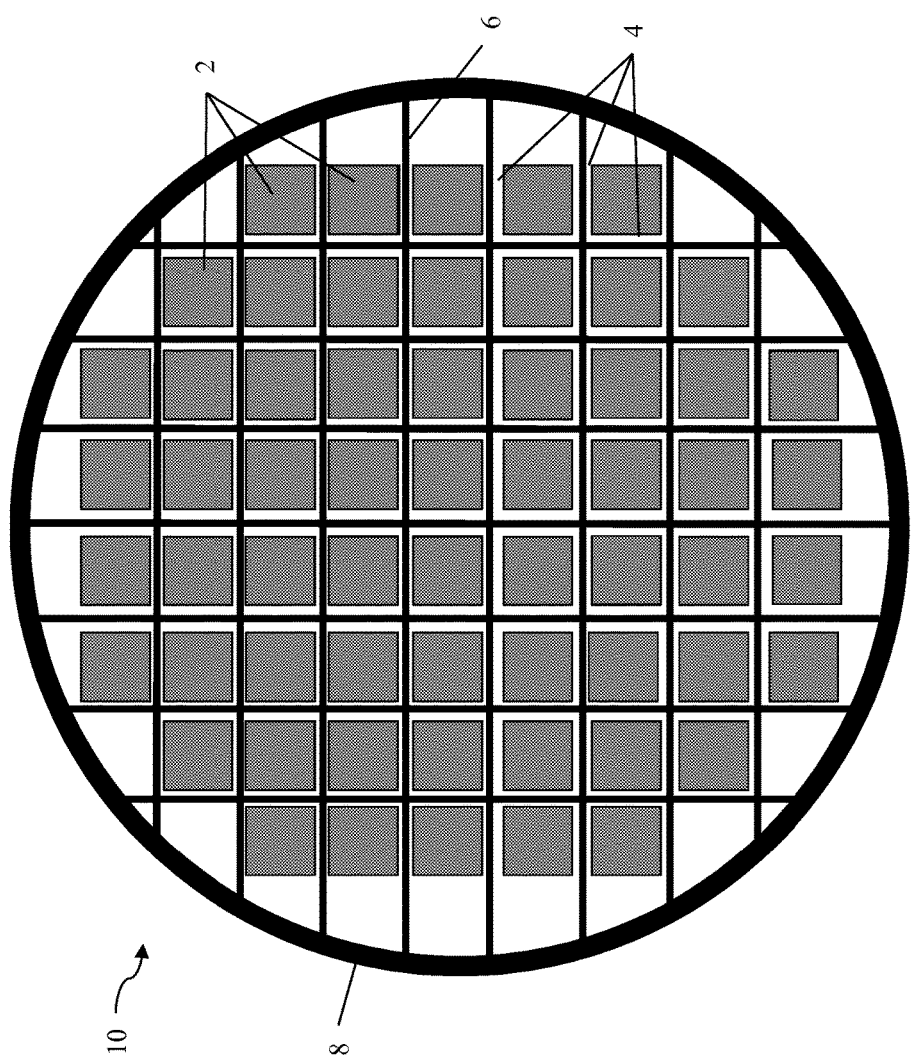
FIG. 1 shows a plan view of a conventional semiconductor wafer.

As shown in FIG. 2, semiconductor wafer 100 may include a first IC chip 112, a second IC chip 114, a third IC chip 116, and a fourth IC chip 118. While only four IC chips 112, 114, 116, 118 are shown in FIG. 2, it is to be understood that wafer 100 may include any number of IC chips. Each IC chip 112, 114, 116, 118 may include a series of levels/layers comprising various semiconductor structures (i.e., diodes, transistors, inductors, etc.) as known in the art. Further, at an uppermost layer (shown), each IC chip 112, 114, 116, 118 may include a guard ring 120 to separate IC chip 112, 114, 116, 118 from kerf region 122 and edge (shown by reference numeral 8 in FIG. 1) of the wafer 100. Guard ring 120 may be used as a crackstop or a ground edge seal to prevent mobile ions from diffusing into the chip, etc. as known in the art. If guard ring 120 is used, then it will need to be designed as to not short out the wires 132 as will be discussed herein. Kerf region 122 physically separates chips 112, 114, 116, 118 on wafer 100. Kerf region 122 may include a conductive kerf bus 124 connected to edge (as shown by reference number 8 in FIG. 1) of wafer 100.

Each IC chip 112, 114, 116, 118 may include wires 132 (shown by the octagonal shapes on each chip 112, 114, 116, 118 in FIG. 2). Referring to FIGS. 2-4 together, each wire 132 may include, for example, an inductor (shown in FIG. 2), a capacitor plate, an interconnect, a local wire, a transmission line, a waveguide, or pads for packaging. As will be described herein, wires 132 may be formed in a dielectric layer 216 on a substrate 202 in a top or last level 218 (i.e., redistribution level) of a chip 112, 114, 116, 118. Wires 132 may include a metal layer 204 and a plated film 210 (FIG. 3). A portion of at least one wire 132 in the array of wires 132 may be connected to kerf bus 124. That is, wires 132 may include an electrical contact 134 to connect wire 132 to kerf bus 124. Electrical contact 134 may include an extension of metal layer 204 and plated film 210 from wire 132 to kerf bus 124. As will be further described, kerf bus 124 may also include metal layer 204 and plated film 210.

Electrical contact 134 facilitates electroplating of metal layer 204 to create plated film 210 of wire 132 as will be described herein. That is, electrical contact 134 supplies some or all of the electrical current needed for the electroplating process from kerf bus 124 to metal layer 204 of wire 132. In one embodiment, some wires 132 may be connected to kerf bus 124 via electrical contacts 134 and other wires 136 (FIG. 2) are not connected to kerf bus 124 via electrical contacts 134. Wires 136 that are not connected to kerf bus 124 will not undergo the electroplating processes because they are not supplied electrical current from kerf bus 124. Therefore, wires 136 will not include plated film 210 but may include metal layer 204. Metal layer 204 is very thin and therefore highly resistive. Wires 136 that are not connected to kerf bus 124 may remain highly resistive because they are not plated. As such, wires 136 may include, for example a fuse or a resistor. Wires 132 which are connected to kerf bus 124 may be low resistance wires because they are plated. If guard ring 120 is used and it is on the same wiring level as wires 132, then it will need to be bypassed (FIG. 3) in the region of electrical contact 134 that connects wire 132 to the kerf bus 124 such that electrical contact 134 passes over guard ring 120 and does not make electrical contact with guard ring 120. That is, guard ring 120 will not be as thick as the substrate 202 that it is disposed within.

A method for plating wires on a wafer will now be described with reference to FIGS. 2-7. As used herein, "depositing" may include, but is not limited to, for example: chemical vapor deposition (CVD), low-pressure CVD (LPCVD), plasma-enhanced CVD (PECVD), semi-atmosphere CVD (SACVD), high density plasma CVD (HDCVD), rapid thermal CVD (RTCVD), ultra-high vacuum CVD (UHCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. Additionally, as used herein, "etching" can include, but is not limited to, any now known or later developed techniques appropriate for the material to be etched including but not limited to, for example: isotropic etching, anisotropic etching, plasma etching, sputter etching, ion beam etching, reactive-ion beam etching and reactive-ion etching (RIE).

A portion of the method may include forming an array of IC chips 112, 114, 116, 118 on a wafer 100 as known in the art of semiconductor manufacturing (FIG. 2). As discussed herein, IC chips 112, 114, 116, 118 may have many layers/levels including a redistribution level 218, or the uppermost or top level of chip 112, 114, 116, 118 (FIG. 4). Formation of IC chips 112, 114, 116, 118 may include forming a guard ring 120 in a substrate 202 (FIG. 4) in substrate 202 of the redistribution level 218 as discussed above. Guard ring 120 may separate IC chips 112, 114, 116, 118 and a kerf region 122. Guard ring 120 may be formed by etching a trench in substrate 202 and filling trench with doped polycrystalline silicon, tungsten, or copper, etc. as known in the art. Guard ring 120 must terminate vertically or horizontally prior to the last wire level such that wire 134 does not short to guard ring 120 (FIGS. 3-4).

Substrate 202 may include, but is not limited to, silicon (Si), germanium (Ge), silicon germanium (SiGe), silicon carbide (SiC), and those consisting essentially of one or more III-V compound semiconductors having a composition defined by the formula $Al_{X1}Ga_{X2}In_{X3}AS_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable materials include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire substrate 202 may be strained.

Another portion of the method may include forming a kerf bus 124 in a kerf region 122. Kerf region 122 may be on wafer 100 such that kerf region 122 substantially separates each of the IC chips 112, 114, 116, 118 from each other. Kerf region 122 may include various materials that correspond to the materials used to create each level of the chips. However, as known in the art, those materials function differently in kerf region 122 than they do in chips 112, 114, 116, 118. For example, as described herein, metal layer 204 is deposited on wafer 100 in both kerf region 120 and on chips 112, 114, 116, 118. In kerf region 122, metal layer 204 is used to carry electrical current from edge (shown by reference numeral 8 in FIG. 1) of wafer 100 to metal layer 204 in chips 112, 114, 116, 118. That is, aspects of the present invention use the current from kerf region 122 to plate chips 112, 114, 116, 118 instead of using conventional damascene processes.

Kerf bus 124 may be formed at the same time wires 132 (shown in FIG. 2) are formed and may be electrically connected to the edge (shown by reference numeral 8 in FIG. 1) of the wafer 100. Kerf bus 124 may include a width w1 of, for example, approximately 40-60 microns. Kerf bus 124 may include metal layer 204. Metal layer 204 of kerf bus 124 may be formed of separate layers, e.g., a liner layer and seed layer. Liner layer may include, but is not limited to, titanium nitride (TiN), tantalum nitride (TaN), tantalum (Ta), titanium (Ti). Seed layer may include a copper seed layer disposed over liner layer. Alternatively, metal layer 204 of kerf bus 124 may include a single metallic layer that serves as both a diffusion barrier for copper and seed layer for copper plating, e.g., Ruthenium (Ru).

Figure 5:
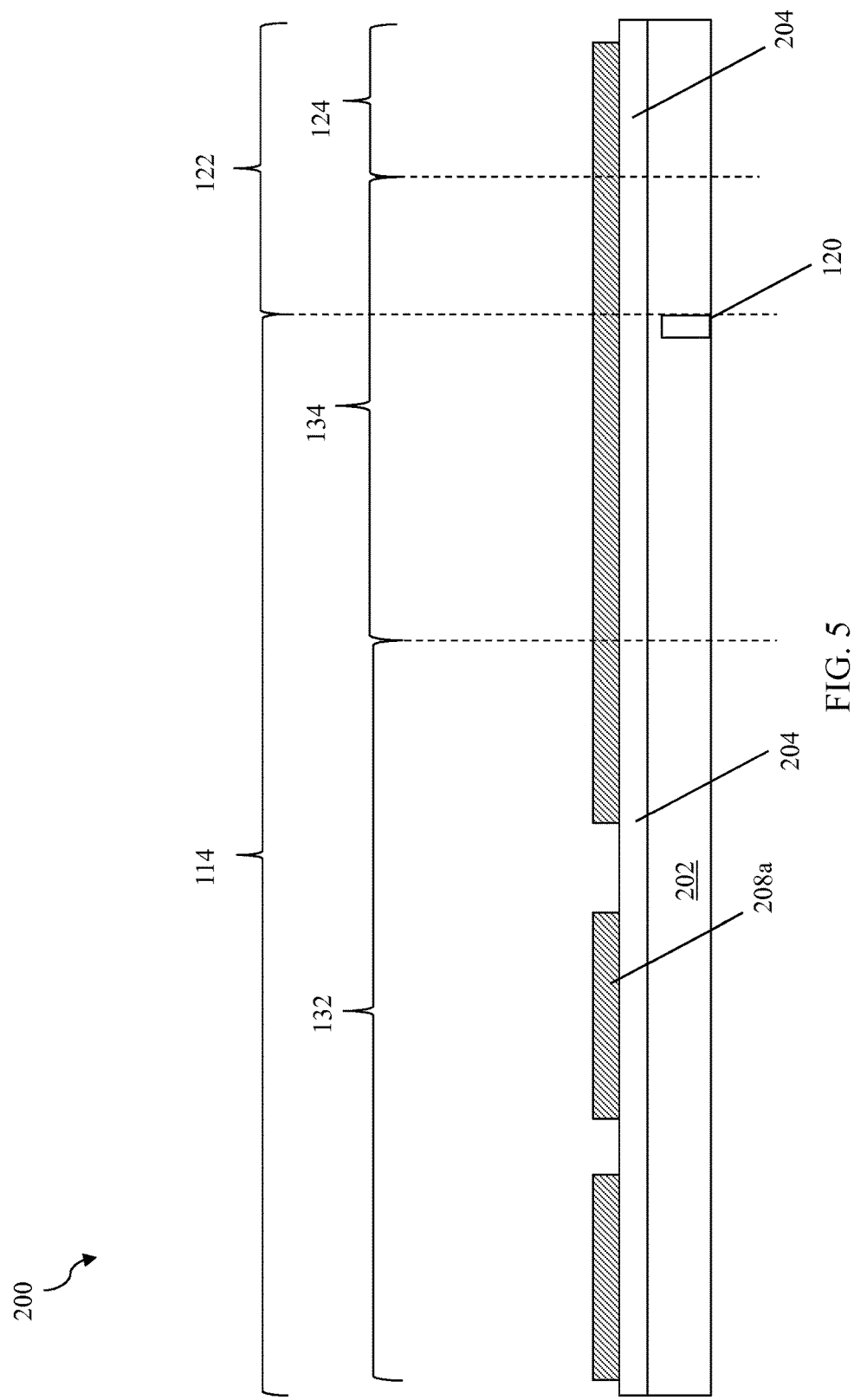
FIGS. 5-7 show the cross-sectional view of FIG. 4 undergoing aspects of the method as described herein.
Figure 6:
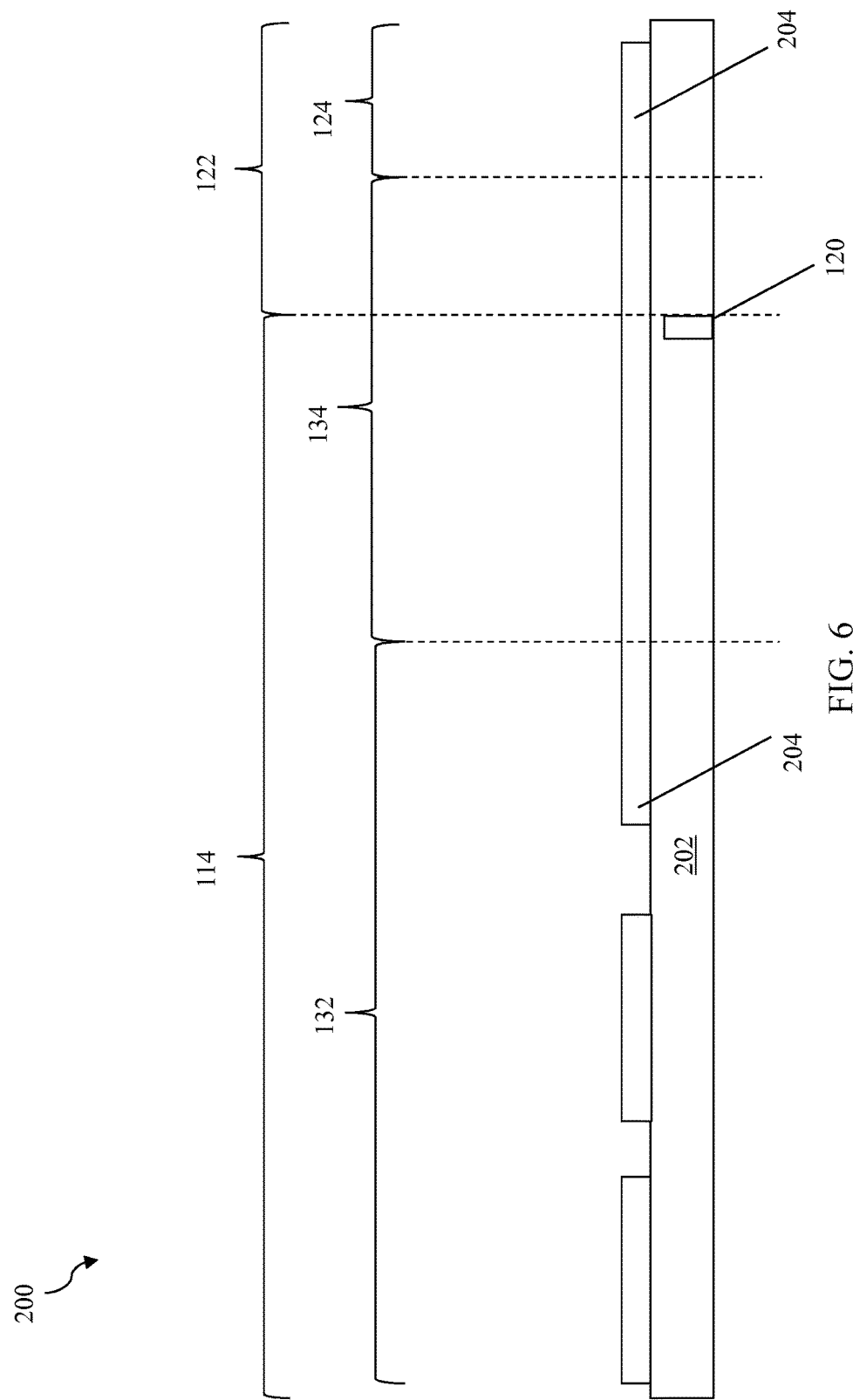
Figure 7:
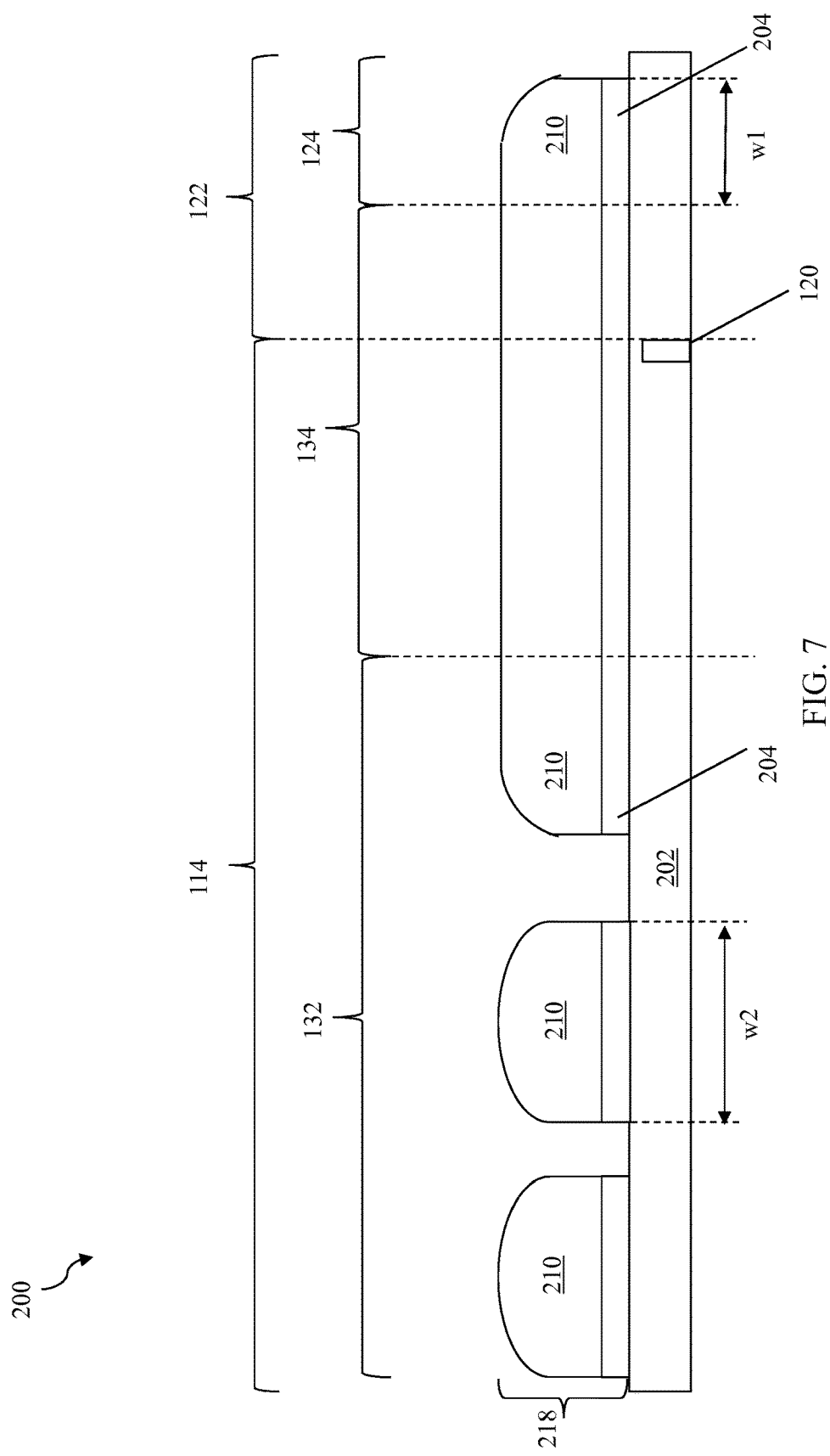

An array of wires may be formed in a dielectric layer 216 at the redistribution level 218 of each IC chip 112, 114, 116, 118 as shown in FIGS. 5-7. Formation of the array of wires may include depositing and patterning a metal layer 204 of each chip 112, 114, 116, 118 on a substrate 202 (FIG. 5). Metal layer 204 of each chip 112, 114, 116, 118 may be formed of separate layers, e.g., a liner layer and seed layer. Liner layer may include, but is not limited to, titanium nitride (TiN), tantalum nitride (TaN), tantalum (Ta), titanium (Ti). Seed layer may include a copper seed layer disposed over liner layer. Alternatively, metal layer 204 of each chip 112, 114, 116, 118 may include a single metallic layer that serves as both a diffusion barrier for copper and seed layer for copper plating, e.g., Ruthenium (Ru).

Metal layer 204 of each chip 112, 114, 116, 118 may be patterned using known photolithographic and etching techniques. For example, photolithography includes forming a radiation sensitive "resist" coating over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

As shown in FIG. 5, a first photoresist 208a may be deposited on metal layer 204 on each chip 112, 114, 116, 118 and patterned (via conventional etching processes). Metal layer 204 on each chip 112, 114, 116, 118 may then be patterned via conventional etching processes. Metal layer 204 on each chip 112, 114, 116, 118 may be etched such that it has a width w2 of, for example, approximately 25 microns. Metal layer 204 on each chip 112, 114, 116, 118 may be patterned such that a portion of metal layer 204 of at least one wire 132 is in electrical contact with kerf bus 124 (FIGS. 4-5) to create electrical contact 134. That is, metal layer 204 on each chip 112, 114, 116, 118 may be etched such that it is in electrical contact with metal layer 204 of kerf bus 124. Electrical contact 134 may include an extension of metal layer 204 from the wire 132 to the kerf bus 124 in kerf region 122. In some embodiments, a portion of metal layer 204 in each wire 132 may contact kerf bus 124 via electrical contact 134. In another embodiment, portions of only some wires 132 may contact kerf bus 124 while other wires 136 may not (FIG. 2). After metal layer 204 on chips 112, 114, 116, 118 is etched, first photoresist 208a may be removed as shown in FIG. 6.

As shown in FIG. 7, plated film 210 is formed by conventional electroplating processes (i.e., electrochemical deposition) of, for example, copper (Cu). It is to be understood that only those wires 132 that include electrical contact 134 will be plated, and thus have a low resistance. Wires 136 that do not include electrical contact 134 connecting wire 136 to kerf bus (FIG. 2) will not be plated, and thus have remain highly resistive. That is, aspects of the present invention allow for the selective design of low or high resistance wires based on the application of the chip. Additionally, a portion of metal layer 204 in kerf bus 124 may undergo the electroplating process such that a plated film 210 is formed over first metal layer 204 in kerf bus 124.

Referring back to FIG. 4 which shows a cross-section of portion 200 of FIG. 2 having undergone the method as described herein, wafer 100 may also include a dielectric layer 216 which may be deposited to passivate IC chips 112, 114, 116, 118. Passivation refers to terminating the chemical and electrical active bonds on the semiconductor surface to assure chemical stability at the surface. Dielectric layer 216 may also be deposited in kerf region 122. Dielectric layer 216 may include one or more dielectric materials including but not limited to: silicon nitride ($Si_3N_4$), silicon oxide ($SiO_2$), fluorinated SiO2 (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or multiple layers thereof. While not shown for clarity, it is to be understood that dielectric layer 216 may include openings or vias to facilitate electrical connections to plated film 210 as is known in the art.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:
1. A method for plating wires on a wafer comprising:
   forming an array of integrated circuit (IC) chips having a redistribution level on the wafer;
   forming a kerf bus, the kerf bus separating each of the IC chips from each other, the kerf bus being connected to an edge of the wafer;

forming an array of wires in the redistribution level of each IC chip, the forming of the array of wires including:
  depositing a metal layer directly over a substrate in the redistribution level;
  applying a photoresist over the metal layer;
  patterning the photoresist to expose the metal layer; and
  etching the metal layer to expose a portion of the substrate in the redistribution level;
electrically connecting at least one wire in the array of wires on each IC chip to the kerf bus; and
copper electroplating the array of IC chips,
wherein only wires in the array of wires connected to the kerf bus are copper electroplated during the electroplating, and wires in the array of wires not connected to the kerf bus are not copper electroplated, wherein the wires not connected to the kerf bus have a greater resistance than the copper electroplated wires after the copper electroplating, wherein the wires not connected to the kerf bus include at least one of a fuse or a resistor.

2. The method of claim 1, further comprising passivating each IC chip with a dielectric material.

3. The method of claim 1, wherein the electrically connecting the at least one wire on each IC chip to the kerf bus includes: forming an electrical contact between at least one wire in the array of wires on each IC chip and the kerf bus, the electrical contact including a portion of the metal layer contacting an edge of the kerf bus to provide electrical continuity from edge of the wafer to the metal layer.

4. The method of claim 1, wherein the copper electroplating the array of IC chips includes: forming a copper plated film over the metal layer.

5. The method of claim 1, wherein the array of wires includes an inductor.

6. A method for plating wires on a wafer comprising:
  forming an array of integrated circuit (IC) chips having a redistribution level on the wafer;
  forming a kerf bus in a kerf region, the kerf region separating each of the IC chips from each other, and the kerf bus being connected to an edge of the wafer;
  depositing a metal layer directly on a substrate in the redistribution level of each IC chip;
  patterning the metal layer to expose a portion of the substrate in the redistribution level and to define an array of wires such that at least one wire in the array of wires on each IC chip is electrically connected to the kerf bus; and
  copper electroplating the IC chips such that a copper plated film is formed on the metal layer of each IC chip,
  wherein only the at least one wire in the array of wires connected to the kerf bus is copper electroplated during the copper electroplating, and wires in the array of wires not connected to the kerf bus are not copper electroplated, wherein the wires not connected to the kerf bus have a greater resistance than the at least one copper electroplated wire after the electroplating, wherein the wires not connected to the kerf bus include at least one of a fuse or a resistor.

7. The method of claim 6, further comprising passivating each IC chip with a dielectric layer.

8. The method of claim 6, wherein the at least one wire on each IC chip is connected to the kerf bus by an electrical contact, the electrical contact including a portion of the metal layer contacting an edge of the kerf bus to provide electrical continuity from the edge of the wafer to the metal layer.

9. The method of claim 6, wherein the copper electroplating the IC chips includes electrochemical deposition of copper on the metal layer.

10. The method of claim 6, wherein the array of wires includes an inductor.

* * * * *